(12) United States Patent
Tooi et al.

(10) Patent No.: US 6,649,995 B2
(45) Date of Patent: Nov. 18, 2003

(54) SEMICONDUCTOR DEVICE AND METHOD OF MANUFACTURING THE SAME

(75) Inventors: Shigeo Tooi, Tokyo (JP); Katsumi Satoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/126,542

(22) Filed: Apr. 22, 2002

(65) Prior Publication Data

US 2003/0075728 A1 Apr. 24, 2003

(30) Foreign Application Priority Data

Oct. 18, 2001 (JP) ........................................ 2001-320502

(51) Int. Cl.[7] .............................................. H01L 29/47
(52) U.S. Cl. .................. 257/472; 257/77; 257/475; 257/487; 257/740; 257/775; 257/784
(58) Field of Search .................. 257/77, 472, 475, 257/487, 740, 775, 784

(56) References Cited

U.S. PATENT DOCUMENTS 5,278,443 A * 1/1994 Mori et al. .................. 257/475
5,345,100 A * 9/1994 Kan et al. .................... 257/475
6,501,145 B1 * 12/2002 Kaminski et al. ........... 257/471

FOREIGN PATENT DOCUMENTS

| JP | 7-30111 | 1/1995 |
| JP | 7-66433 | 3/1995 |
| JP | 10-321879 | 12/1998 |

* cited by examiner

*Primary Examiner*—Jerome Jackson
(74) *Attorney, Agent, or Firm*—Oblon, Spivak, McClelland, Maier & Neustadt, P.C.

(57) ABSTRACT

A Schottky diode that achieves a predetermined reverse-direction breakdown voltage even if a state of a surface in a vicinity of a Schottky junction interface changes due to a welding of a bonding wire. The semiconductor device having the Schottky junction includes a semiconductor substrate of a first conductivity type. A well region of a second conductivity type is formed in a top surface of the semiconductor substrate. A Schottky electrode is formed on the top surface of the semiconductor substrate. A connecting conductive member is electrically connected to the Schottky electrode. The connecting conductive member is selectively connected to the Schottky electrode above the well region such that a connection surface between the connecting conductive member and the Schottky electrode is not extended above a Schottky junction between the Schottky electrode and the semiconductor substrate of the first conductivity type.

7 Claims, 3 Drawing Sheets

SEMICONDUCTOR DEVICE AND METHOD OF MANUFACTURING THE SAME

BACKGROUND OF THE INVENTION

1. Field of the Invention

The present invention relates to a semiconductor device having a Schottky junction, and more particularly, to a Schottky diode using a wideband gap semiconductor device.

2. Description of the Related Art

Exhibiting better thermal stability and higher thermal conductivity than silicon, silicon carbide realizes operations at a high temperature and is suitable to a reduction in size and an increase in device density. In addition, since a breakdown voltage of silicon carbide is approximately ten times as large as that of silicon, it is possible to obtain a high capability of blocking a voltage (reverse-direction breakdown voltage).

FIG. 5 is a cross sectional view of a Schottky diode having a conventional structure generally denoted at 500. The Schottky diode 500 includes a silicon carbide substrate 501, and a Schottky electrode 502 of platinum is formed in the top surface of the silicon substrate 501. On the other hand, an ohmic electrode 503 of nickel is formed at the bottom surface. The ohmic electrode 503 is connected onto a conducting plate 505, an external main electrode, by a solder layer 504. The conducting plate 505, made of copper, also functions as a heat-sink.

A bonding wire 506 of aluminum is welded on the Schottky electrode 502 by ultrasonic pressure bonding. The welding of the bonding wire 506 is performed after the silicon carbide substrate 501 is fixed to the conducting plate 505. The Schottky electrode 502 is connected with the other external main electrode (not shown) via the bonding wire 506.

In the Schottky diode 500, since the breakdown voltage is high as described above, the thickness of the silicon carbide substrate 501 needed to obtain a predetermined reverse-direction breakdown voltage (voltage blocking capability) may be thinner. This allows shortening the distance between the electrodes 502 and 503, and hence, largely reduce a current-carrying loss (steady-state loss) at turning the power on.

The breakdown voltage above is dependent upon the width of a depletion layer in the vicinity of the Schottky junction, and the width of the depletion layer is largely influenced by a surface state of the silicon carbide substrate 501.

In the Schottky diode 500, at a step of welding the bonding wire 506 on the Schottky electrode 502, the silicon carbide substrate 501 is subjected to stress in the vicinity of an interface with the Schottky junction. Hence, the surface state of the silicon carbide substrate 501 changes to reduce the reverse-direction breakdown voltage. As a result of this, it has been impossible to achieve a designed voltage blocking capability.

In contrast, if the pressure for welding is reduced in order to decrease the stress upon the silicon carbide substrate 501, a contact resistance between the Schottky electrode 502 and the bonding wire 506 becomes large and a current-carrying loss increases while the bonding strength decreases. This resulted in a damage induced by thermal stress.

SUMMARY OF THE INVENTION

Accordingly, the present invention aims at providing a Schottky diode realizing a predetermined reverse-direction breakdown voltage even if welding of a bonding wire changes a surface state near an interface with a Schottky junction, and a method of manufacturing such a Schottky diode.

The present invention is directed to a semiconductor device having a Schottky junction. The semiconductor device includes a semiconductor substrate of the first conductivity type. A well region of the second conductivity type is formed in the top surface of the semiconductor substrate. A Schottky electrode is formed on the top surface of the semiconductor substrate and has a Schottky junction with the semiconductor substrate. Also, a connecting conductive member is electrically connected on the Schottky electrode. The connecting conductive member is selectively connected with the Schottky electrode above the well region. In this semiconductor device, a depletion layer is formed in the vicinity of the pn junction interface between the semiconductor substrate and the well region. Also, the connection surface between the connecting conductive member and the Schottky electrode is included in the top surface of the Schottky electrode located above the well region. Since this depletion layer is not affected by connection of the connecting conductive member, it is possible to obtain a desired reverse-direction breakdown voltage.

The present invention is also directed to a method of manufacturing a semiconductor device having a Schottky junction. The method includes a step of preparing a semiconductor substrate of the first conductivity type, a step of forming a well region of the second conductivity type in the top surface of the semiconductor substrate, a step of forming a Schottky electrode on the top surface of the semiconductor substrate, and a connection step of electrically connecting a connecting conductive member on the Schottky electrode. The connection step includes a step of selectively connecting the connecting conductive member with the Schottky electrode above the well region. Using such a method, it is possible to prevent a decrease in reverse-direction breakdown voltage at the step of connecting the connecting conductive member.

DETAILED DESCRIPTION OF THE PREFERRED EMBODIMENTS

Embodiment 1

Figure 1:
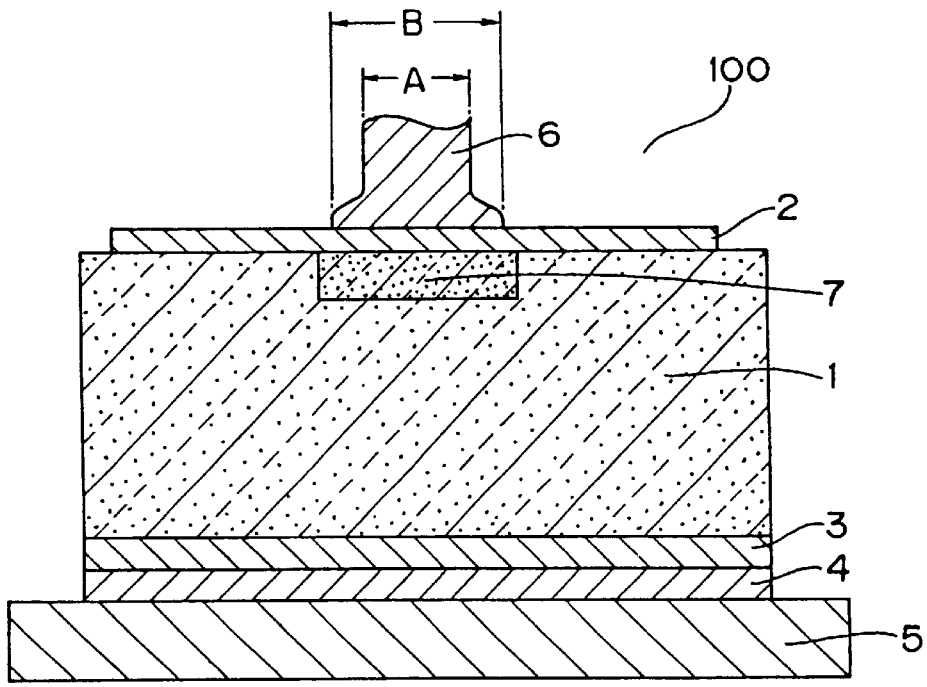
FIG. 1 is a cross sectional view of the Schottky diode according to the embodiment 1 of the present invention.

FIG. 1 is a cross sectional view of a Schottky diode according to a first preferred embodiment generally denoted at 100. The Schottky diode 100 includes an n-type silicon carbide substrate 1. A p-type well region 7 with a predetermined depth is formed in the top surface of the silicon carbide substrate 1. In addition, a Schottky electrode 2 of titanium, nickel or the like is formed on the top surface of the silicon carbide substrate 1 including the well region 7.

On the other hand, an ohmic electrode 3 of nickel or the like is formed at the bottom surface of the silicon carbide substrate 1. The ohmic electrode 3 is connected with a conducting plate 5 of copper or the like by a solder layer 4. The conducting plate 5 serves as one external main electrode as well as a heat dissipation plate.

A bonding wire 6 of aluminum for instance is welded on the Schottky electrode 2 by ultrasonic pressure bonding. As shown in FIG. 1, a connecting surface where the Schottky electrode 2 and the bonding wire 6 contact with each other is contained in the top surface of the Schottky electrode 2 located above the well region.

The other end of the bonding wire 6 is connected with the other external main electrode (not shown).

A method of manufacturing the Schottky diode 100 will now be briefly described.

First, the n-type silicon carbide substrate 1 is prepared and p-type ions such as Al and B are selectively implanted from the top surface of the silicon carbide substrate 1, whereby the p-type well region 7 is formed.

Next, nickel for example is deposited at the bottom surface of the silicon carbide substrate 1 and a predetermined thermal processing is performed, thereby forming the ohmic electrode 3. Further, nickel for example is then deposited on the top surface of the silicon carbide substrate 1, whereby the Schottky electrode 2 is formed. The ohmic electrode 3 is connected on the conducting plate 5 of copper, for instance, by the solder layer 4 to fix the silicon carbide substrate 1 with the electrodes 2 and 3 on the top and bottom surfaces, respectively.

Next, the bonding wire 6 of aluminum for example is welded by ultrasonic pressure bonding on the Schottky electrode 2 above the well region 7. At the ultrasonic pressure bonding step, the bonding wire 6 is vibrated at a predetermined amplitude while pressing the bonding wire 6 upon the surface of the Schottky electrode 2. This applies stress also near an interface between the Schottky electrode 2 and the silicon carbide substrate 1 during the pressure bonding step. Depending on conditions such as the applied pressure and the amplitude, the tip end of the bonding wire 6 crushes into different widths (denoted at B in FIG. 1). The tougher the conditions are, the wider the width of crush becomes. Meanwhile, the other end of the bonding wire 6 is similarly welded to the other external main electrode (not shown) by an ultrasonic pressure bonding method.

Thermal pressure bonding or the like may be used for welding of the bonding wire 6. Whichever method is used, stress is applied in the vicinity of the interface between the Schottky electrode 2 and the silicon carbide substrate 1.

Figure 5:
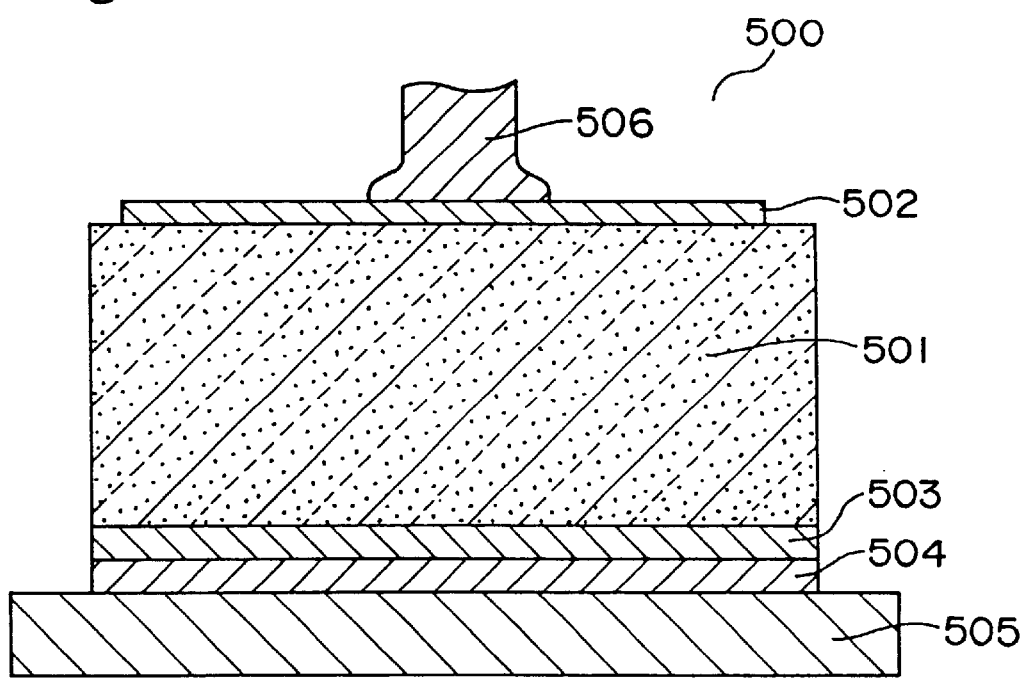
FIG. 5 is a cross sectional view of a Schottky diode with the conventional structure.

A reverse-direction breakdown voltage characteristic of a Schottky junction between the Schottky electrode 2 and the silicon carbide substrate 1 is largely influenced by a surface state of the silicon carbide substrate 1. Hence, as in the conventional structure shown in FIG. 5, if a Schottky junction is in a lower part of the connecting surface between the bonding wire 506 and the Schottky electrode 502, the surface state of the silicon carbide substrate 1 easily changes due to the stress applied at the pressure bonding step of pressing the bonding wire 506. Therefore, the reverse-direction breakdown voltage (voltage blocking capability) changes as well.

Conversely, in the Schottky diode 100 according to the first preferred embodiment, the silicon carbide substrate 1 and the well region 7 fabricate a pn junction with a reverse-direction breakdown voltage characteristic sufficient for an element characteristic. Even if the reverse-direction breakdown voltage (breakdown voltage A) at a Schottky interface between the Schottky electrode 2 and the well region 7 changes due to the influence of the pressure bonding step, the reverse-direction breakdown voltage (breakdown voltage B) at the pn junction interface between the silicon carbide substrate 1 and the well region 7 does not change.

Hence, as long as the breakdown voltage B is designed to be equal to or larger than the required reverse-direction breakdown voltage for the Schottky diode 100, a variation in breakdown voltage A does not influence the element characteristic.

Alternatively, the impurity concentration or the like of the well region 7 may be adjusted so that the interface between the Schottky electrode 2 and the well region 7 becomes an ohmic contact. In this case, a depletion layer is not formed in the vicinity of the interface between the Schottky electrode 2 and the well region 7.

Figure 2:
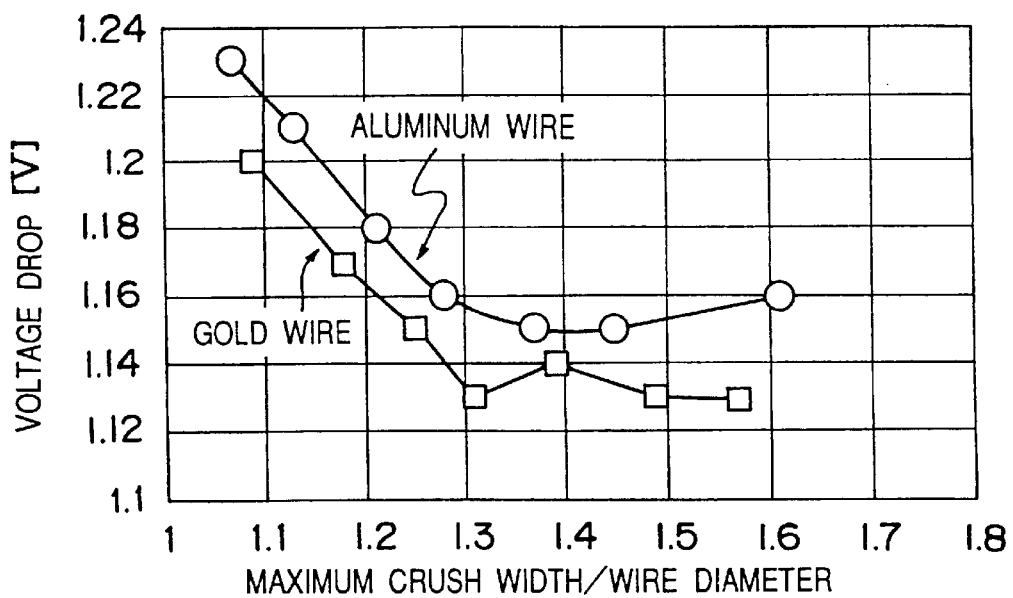
FIG. 2 shows the relationship between the maximum crush width/wire diameter and the voltage drop.

FIG. 2 shows a relationship between a maximum crush width/wire diameter of the bonding wire 6 welded to the Schottky electrode 2 and a voltage drop occurring between the external main electrodes.

The horizontal axis denotes the maximum crush width/wire diameter while the vertical axis denotes the voltage drop in FIG. 2. The maximum crush width is the size (diameter) of B in FIG. 1, the wire diameter of the bonding wire 6 expanded by pressure bonding method. Meanwhile, the wire diameter is the size (diameter) of A in FIG. 1.

Whichever material between aluminum and gold is used as the material of the bonding wire 6, if the maximum crush width/wire diameter becomes smaller than 1.3, the voltage drop becomes large. This is considered to be due to a larger resistance in the area where the bonding wire 6 and the Schottky electrode 2 are welded. On the other hand, if the maximum crush width/wire diameter becomes larger than 1.3, the voltage drop becomes approximately constant.

Hence, for reduction in voltage drop, it is preferable that the maximum crush width/wire diameter is approximately 1.3 or larger.

As described above, in the Schottky diode 100 according to the first preferred embodiment, as the well region 7 is formed in the silicon carbide substrate 1, a decrease in reverse-direction breakdown voltage is prevented, which would otherwise occur due to welding of the bonding wire 6.

In addition, with the maximum crush width/wire diameter set to approximately 1.3 or larger, it is possible to obtain the Schottky diode 100 with a current-carrying loss small.

Embodiment 2

Figure 3:
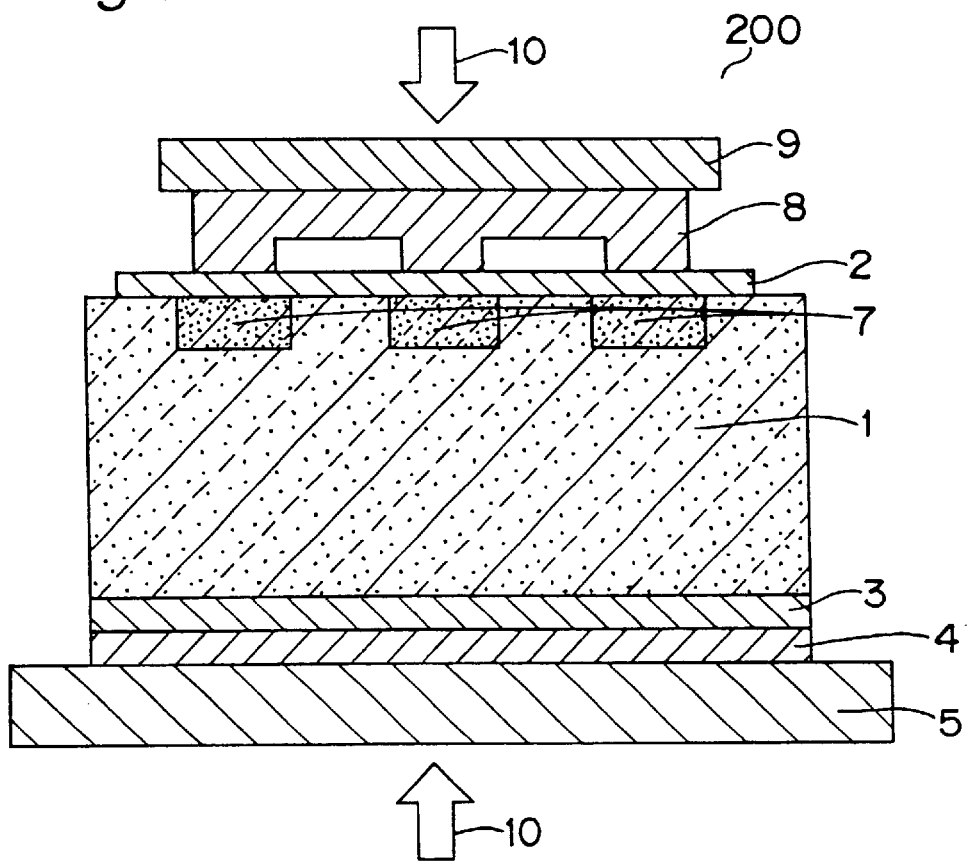
FIG. 3 is a cross sectional view of the Schottky diode according to the embodiment 2 of the present invention.

FIG. 3 is a cross sectional view of a Schottky diode according to a second preferred embodiment generally denoted at 200. In FIG. 3, the same reference symbols as those in FIG. 1 denote the same or corresponding portions.

In the Schottky diode 200, a plurality of p-type well regions 7 are formed in the top surface of the n-type silicon carbide substrate 1. The Schottky electrode 2 of titanium, nickel or the like is formed on the top surface of the silicon carbide substrate 1.

On the other hand, the ohmic electrode 3 of nickel or the like is formed at the bottom surface of the silicon carbide substrate 1, and connected with the conducting plate 5, an external main electrode, by the solder layer 4.

A conductive base member 8 of copper for instance is mounted on the Schottky electrode 2. The conductive base member 8 has a plurality of leg portions to keep up on the Schottky electrode 2. The contact surfaces between the leg portions and the Schottky electrode 2 are contained in the surface of the Schottky electrode 2 located above the well regions 7. Further, another external main electrode 9 of copper for example is mounted on the conductive base member 8.

The Schottky electrode 2, the conductive base member 8 and the external main electrode 9 are not bonded to each other but fixed by applying a load in the direction of the arrow 10. The Schottky diode 200 is used with a load applied in the direction of the arrow 10.

In the Schottky diode 200, a load is applied in the direction of the arrow 10 and thereby the leg portions of the conductive base member 8 apply stress in the vicinity of the Schottky interface between the silicon carbide substrate 1 and the Schottky electrode 2. Hence, the surface state of the silicon carbide substrate 1 is influenced and the reverse-direction breakdown voltage in the Schottky junction changes.

In the Schottky diode 200, however, a depletion layer is also formed in the vicinity of the pn junction interface between the silicon carbide substrate 1 and the well regions 7. Therefore, even when the reverse-direction breakdown voltage (breakdown voltage A) at the Schottky interface between the Schottky electrode 2 and the well regions 7 changes due to an influence of the load, the reverse-direction breakdown voltage (breakdown voltage B) at the pn junction interface between the silicon carbide substrate 1 and the well regions 7 does not change.

Hence, as long as the breakdown voltage B is designed to be equal to or larger than the required reverse-direction breakdown voltage for the Schottky diode 200, a variation in breakdown voltage A does not influence the element characteristic.

Alternatively, the impurity concentration or the like of the well region 7 may be adjusted so that the interface between the Schottky electrode 2 and the well regions 7 becomes an ohmic contact. In this case, a depletion layer is not formed in the vicinity of the interface between the Schottky electrode 2 and the well regions 7.

Figure 4:
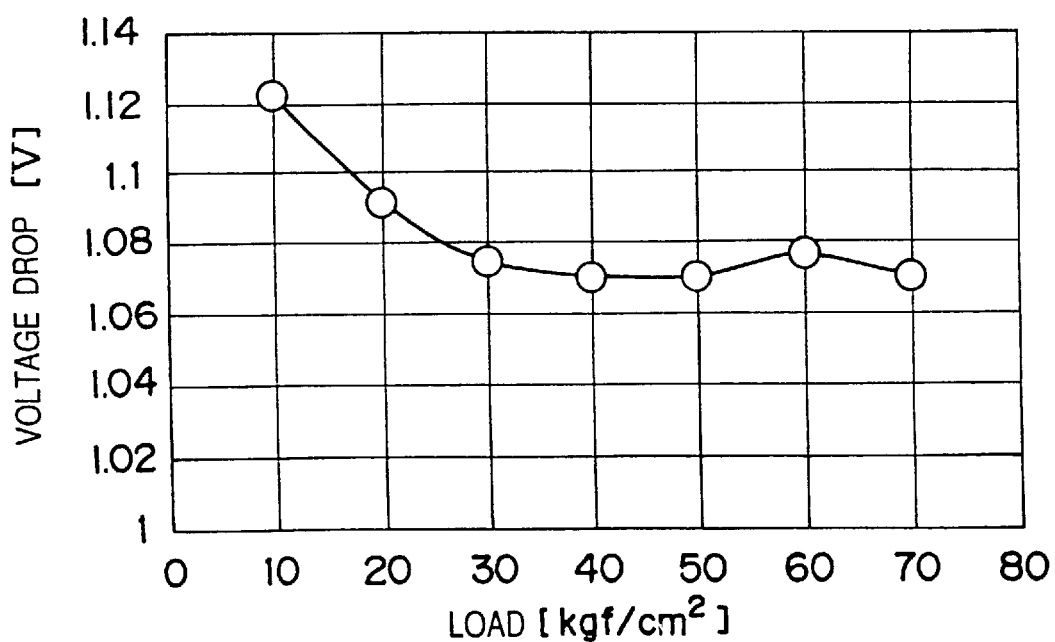
FIG. 4 shows the relationship between the load and the voltage drop.

FIG. 4 shows a relationship between the load applied in the direction of the arrow 10 and a voltage drop occurring between the external main electrodes 5 and 9. As shown in FIG. 4, as the load increases, the value of the voltage drop decreases, and becomes almost constant with the load of about 30 kgf/cm$^2$ or larger.

Hence, with the load set to be approximately 30 kgf/cm$^2$ or larger, it is possible to ensure that the voltage drop in the Schottky diode 200 is small, and therefore, obtain the Schottky diode 200 with a current-carrying loss small.

As described above, in the Schottky diode 200 according to the second preferred embodiment, as the well regions 7 are formed in the silicon carbide substrate 1, a decrease in reverse-direction breakdown voltage in the element through applying the load is prevented.

In addition, with the load applied between the external main electrodes set to be approximately 30 kgf/cm$^2$ or larger, it is possible to obtain the Schottky diode 200 whose current-carrying loss is small.

Although silicon carbide is used as the material of the substrate in the above first and second preferred embodiments, other wideband gap materials such as gallium nitride and diamond may be used as the material of the substrate. Instead, a semiconductor material such as silicon and gallium arsenide may be used.

Further alternatively, a p-type silicon carbide substrate may be used and an n-type well region may be formed in the substrate.

What is claimed is:

1. A semiconductor device having a Schottky junction, comprising:

a semiconductor substrate of a first conductivity type;

a well region of a second conductivity type formed in a top surface of said semiconductor substrate;

a Schottky electrode formed on the top surface of said semiconductor substrate and having the Schottky junction with said semiconductor substrate; and a connecting conductive member electrically connected to said Schottky electrode, wherein said connecting conductive member is selectively connected with said Schottky electrode above said well region such that a connection surface between said connecting conductive member and said Schottky electrode is not extended above a Schottky junction between said Schottky electrode and said semiconductor substrate of said first conductivity type.

2. The semiconductor device according to claim 1, wherein a connection surface between said connecting conductive member and said Schottky electrode is included in the top surface of said Schottky electrode located above said well region.

3. The semiconductor device according to claim 1, wherein said connecting conductive member is welded to said Schottky electrode.

4. The semiconductor device according to claim 3, wherein said connecting conductive member is made of a bonding wire and a diameter of the bonding wire in the welded area is approximately 1.3 times as large as a diameter of the bonding wire or larger.

5. The semiconductor device according to claim 1, wherein said connecting conductive member is made of a conductive base member fixed to press said Schottky electrode.

6. The semiconductor device according to claim 5, wherein a pressing force of said conductive base member upon said Schottky electrode is approximately 30 kgf/cm$^2$ or larger.

7. The semiconductor device according to claim 1, wherein said semiconductor substrate is made of one material selected from the material group of silicon carbide, gallium nitride and diamond.

\* \* \* \* \*